(12) United States Patent
Kim

(10) Patent No.: US 7,199,630 B2
(45) Date of Patent: Apr. 3, 2007

(54) DELAY LOCKED LOOPS AND METHODS USING RING OSCILLATORS

(75) Inventor: Kyu-hyoun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 11/158,013

(22) Filed: Jun. 21, 2005

(65) Prior Publication Data
US 2006/0076992 A1  Apr. 13, 2006

(30) Foreign Application Priority Data
Oct. 12, 2004  (KR) ...................... 10-2004-0081352

(51) Int. Cl.
*H03L 7/06* (2006.01)
(52) U.S. Cl. ...................... 327/158; 327/149
(58) Field of Classification Search ...................... None
See application file for complete search history.

(56) References Cited
U.S. PATENT DOCUMENTS

| | | | | |
|---|---|---|---|---|
| 5,771,264 A * | 6/1998 | Lane | ........................... | 375/376 |
| 6,208,183 B1 * | 3/2001 | Li et al. | ...................... | 327/161 |
| 6,295,328 B1 * | 9/2001 | Kim et al. | .................. | 375/376 |
| 6,333,896 B1 * | 12/2001 | Lee | ............................ | 365/233 |
| 6,366,148 B1 * | 4/2002 | Kim | ............................ | 327/262 |
| 6,445,234 B1 * | 9/2002 | Yoon et al. | .................. | 327/161 |
| 6,580,299 B2 | 6/2003 | Horan et al. | | |
| 6,683,506 B2 | 1/2004 | Ye et al. | | |
| 6,982,579 B2 * | 1/2006 | Lee | ............................ | 327/158 |
| 6,987,409 B2 | 1/2006 | Kim et al. | | |
| 2004/0046596 A1 | 3/2004 | Kaeriyama et al. | | |
| 2004/0160250 A1 | 8/2004 | Kim et al. | | |

FOREIGN PATENT DOCUMENTS
KR  10-2004-0064036  7/2004

OTHER PUBLICATIONS
Notice to Submit Response for Korean Patent Application No. 10-2004-0081352 mailed on Feb. 28, 2006.

* cited by examiner

*Primary Examiner*—Timothy P. Callahan
*Assistant Examiner*—Cassandra Cox
(74) *Attorney, Agent, or Firm*—Myers Bigel Sibley & Sajovec, P.A.

(57) ABSTRACT

Delay locked loops include a ring oscillator having serially connected inverters and a feedback path around the serially connected converters. The ring oscillator is configured to generate an output clock signal that is a delayed version of an input clock signal, in response to the input clock signal and to a control signal that is applied to the ring oscillator. A phase responsive circuit is configured to generate the control signal in response to a phase difference between the input clock signal and the output clock signal. Analogous methods of delaying a clock signal also are described.

13 Claims, 5 Drawing Sheets

DELAY LOCKED LOOPS AND METHODS USING RING OSCILLATORS

CROSS-REFERENCE TO RELATED PATENT APPLICATION

This application claims the benefit under 35 USC § 119 of Korean Patent Application No. 2004-0081352, filed on Oct. 12, 2004, the disclosure of which is hereby incorporated herein by reference in its entirety as if set forth fully herein.

FIELD OF THE INVENTION

The present invention relates to clock circuits and methods, and more particularly to delay locked loops (DLL)

BACKGROUND OF THE INVENTION

Phase locked loops (PLL) and delay locked loops (DLL) are widely used to control clock signals.

FIG. 1 is a block diagram of a conventional PLL 100. The PLL 100 includes a phase detector 110, a charge pump 120, a loop filter 130, and an oscillator 140. The PLL 100 generates an output clock signal MCLK by multiplying the frequency of an input clock signal CLK using the oscillator 140. The oscillator 140 has a ring oscillator structure in which the output clock signal MCLK, which is output from a plurality of inverters 141 through 143 connected in series, is fed back to the first inverter 141. The frequency of the output clock signal MCLK is determined by the voltage level of a control signal VCTL generated by the loop filter 130. The phase detector 110 detects the phase difference between the input clock signal CLK and the output clock signal MCLK. The charge pump 120 generates a current corresponding to the phase difference, and the loop filter 130 generates the control signal VCTL at a voltage level corresponding to the current generated by the charge pump 120.

FIG. 2 is a block diagram of a conventional delay locked loop (DLL) 200. The DLL 200 includes a phase detector 210, a charge pump 220, a loop filter 230, and a delay circuit 240. The DLL 200 generates a signal by delaying an input clock signal CLK for a predetermined time using the delay circuit 240. The delay circuit 240 uses a plurality of inverters 241 through 243, which are connected in series, as delayers, and generates an output clock signal DCLK by delaying the input clock signal CLK for a predetermined time. The predetermined time is determined by the voltage level of a delay control signal VCTL generated by the loop filter 230. The phase detector 210 detects the phase difference between the input clock signal CLK and the output clock signal DCLK. The charge pump 220 generates a current corresponding to the phase difference, and the loop filter 230 generates the delay control signal VCTL with the voltage level corresponding to the current generated by the charge pump 220.

The conventional PLL 100 may be relatively insensitive to external jitter since the input clock signal CLK is not input to the oscillator 140. However, accumulation of jitter generated inside the oscillator 140 may reduce or prevent the stable generation of output clock signal MCLK. The conventional DLL 200 also may be relatively insensitive to jitter generated inside the delay circuit 240 since the input clock signal CLK is input to the delay circuit 240. However, in this case, external jitter may not be filtered and may be completely delivered to the delay circuit 240.

SUMMARY OF THE INVENTION

Delay locked loops according to exemplary embodiments of the present invention comprise a ring oscillator including a plurality of serially connected inverters and a feedback path around the plurality of serially connected converters. The ring oscillator is configured to generate an output clock signal that is a delayed version of an input clock signal, in response to the input clock signal and to a control signal that is applied to the ring oscillator. A phase responsive circuit is configured to generate the control signal in response to a phase difference between the input clock signal and the output clock signal. Analogous methods of delaying a clock signal also may be provided.

According to other exemplary embodiments of the present invention, a delay locked loop includes a delay circuit that is configured to generate an output clock signal by delaying an input clock signal according to a voltage of a control signal. The delay circuit comprises an oscillating circuit to which the input clock signal is input. A phase detector is configured to receive the output clock signal as a feedback signal, to detect a phase difference between the input clock signal and the feedback signal, and to output a result of detection. A charge pump is configured to generate a current corresponding to the result of detection. A loop filter is configured to output the control signal as a voltage that corresponds to (e.g., is proportional to) the current.

In some embodiments, the delay locked loop further includes an output buffer that is configured to buffer and output the output clock signal, and a delay replica unit that is configured to delay the output clock signal for an amount of time that the output clock signal is delayed by the output buffer, and to output the result of delaying. The phase detector receives an output of the delay replica unit as the feedback signal. In other embodiments, the oscillating circuit is configured to change the phase of the output clock signal in response to the control signal while maintaining the frequency of the output clock signal to correspond to the frequency of the input clock signal.

According to other exemplary embodiments of the present invention, methods of locking a clock signal include generating an output clock signal by delaying an input clock signal according to a voltage of a control signal, using an oscillating circuit to which the input clock signal is input. A phase difference between the input clock signal and the output clock signal is detected. A current is generated corresponding to the result of detection, and the control signal is output as a voltage which corresponds to (e.g., is proportional to) the generated current.

DETAILED DESCRIPTION

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. Like numbers refer to like elements throughout. As used herein the term "and/or" includes any and all combinations of one or more of the associated listed items and may be abbreviated by "/".

It will also be understood that, although the terms first, second, etc. may be used herein to describe various elements, these elements should not be limited by these terms. These terms are only used to distinguish one element from another element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described in part below with reference to block diagrams according to embodiments of the invention. It will be understood that a block of the block diagrams, and combinations of blocks in the block diagrams create means, devices or methods for implementing the functions/acts specified in the block diagram block or blocks.

Figure 3:
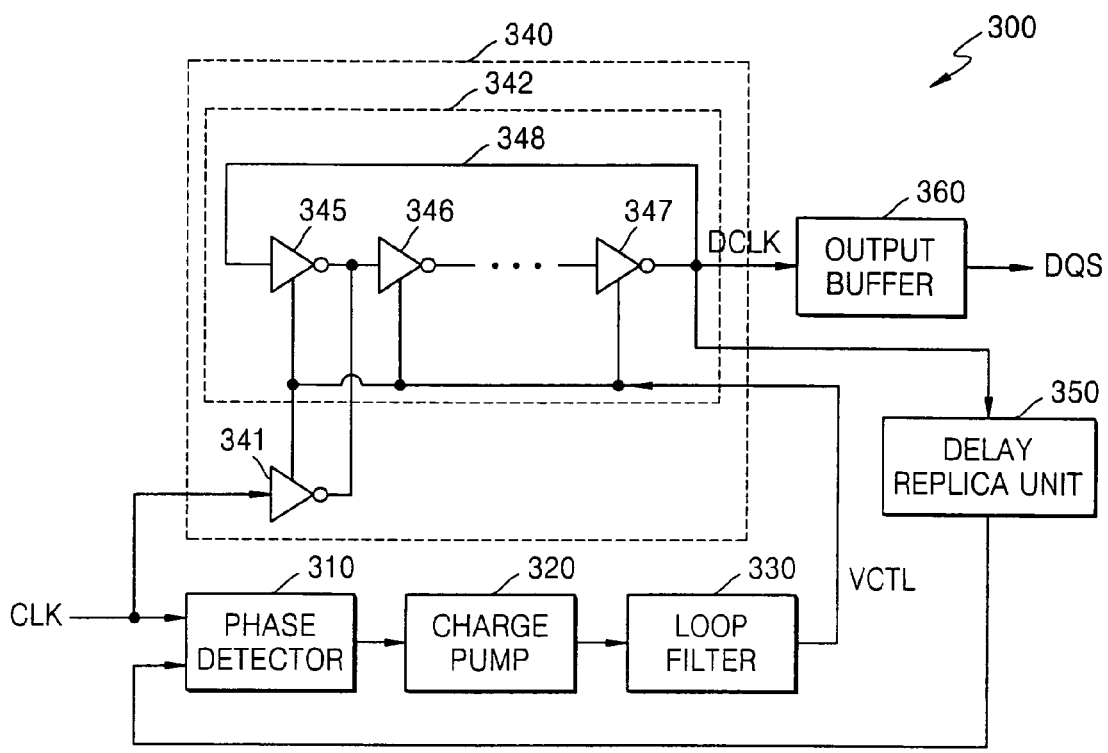
FIG. 3 is a block diagram of a DLL according to exemplary embodiments of the present invention.

FIG. 3 is a block diagram of a delay locked loop (DLL) 300 according to exemplary embodiments of the present invention. The DLL 300 includes a phase detector 310, a charge pump 320, a loop filter 330, and a delay circuit 340.

Figure 1:
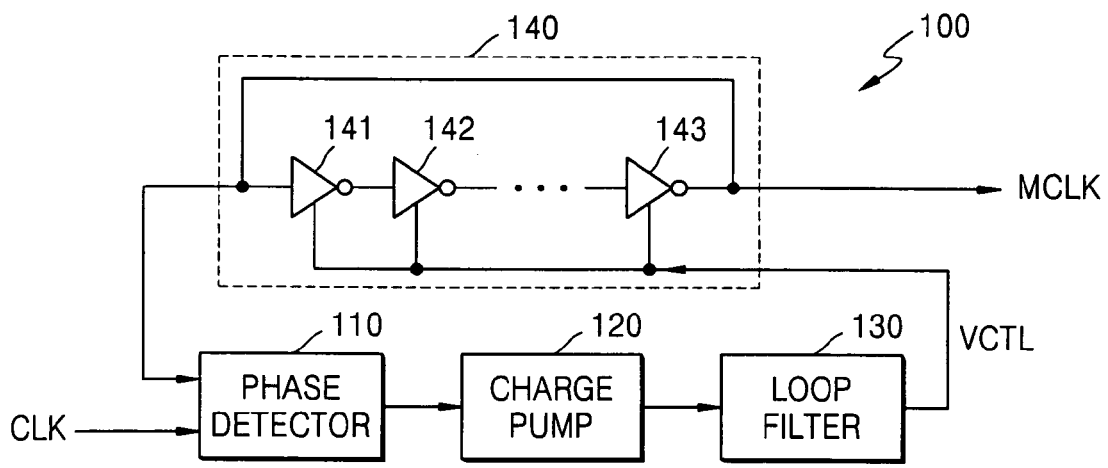
FIG. 1 is a block diagram of a conventional phase locked loop (PLL)
Figure 2:
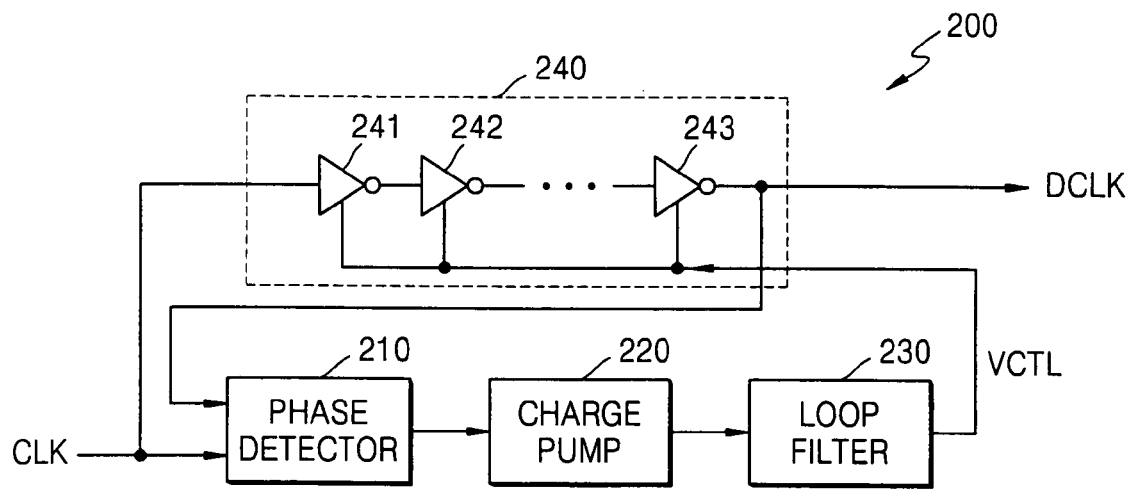
FIG. 2 is a block diagram of a conventional delay locked loop (DLL)

As described above, a conventional delay circuit 240 of FIG. 2 uses the inverters 241 through 243 connected in series as delayers, whereas the delay circuit 340 uses an oscillating circuit to which an input clock signal CLK is input. Referring to FIG. 3, the delay circuit 340 includes an inverter 341 that inverts an input clock signal CLK, and a ring oscillator 342 that includes a plurality of inverters 345 through 347. More than three inverters may be provided. The inverters 345 through 347 are serially connected such that an output clock signal DCLK output from a last inverter 347 is fed back to a first inverter 345 using a feedback path 348 around the plurality of serially connected inverters. As shown in FIG. 3, a signal output from the first inverter 345 is transmitted to a next inverter 346. The inverter 346 simultaneously receives both the signal output from the first inverter 345, and an inversion signal obtained by inverting the input clock signal CLK by the inverter 341.

The oscillating circuit of the delay circuit 340 maintains the frequency of the output clock signal DCLK to correspond to that of the input clock signal CLK. The delay circuit 340 delays the input clock signal CLK according to the voltage level of a control signal VCTL so as to generate the output clock signal DCLK that is out of phase with the input clock signal CLK. The control signal VCTL may be applied to a control input of the inverter such as a power supply or ground voltage input.

Accordingly, FIG. 3 illustrates delay locked loops according to exemplary embodiments of the present invention that include a ring oscillator 342 including a plurality of serially connected inverters 345, 346 and 347, and a feedback path 348 around the plurality of serially connected inverters. The ring oscillator 342 is configured to generate an output clock signal DCLK that is a delayed version of an input clock signal CLK, in response to the input clock signal CLK and to a control signal VCTL that is applied to the ring oscillator 342. A phase responsive circuit, which may include a phase detector 310, a charge pump 320 and/or a loop filter 330, is configured to generate the control signal VCTL in response to a phase difference between the input clock signal CLK and the output clock signal DCLK.

FIG. 3 also illustrates embodiments of the invention wherein a respective inverter 345, 346 or 347 includes an inverter input, an inverter output and a control input, wherein the plurality of inverters are serially connected by connecting an inverter output of an immediately preceding inverter to an inverter input of an immediately succeeding inverter, and wherein the feedback path 348 is provided by connecting an inverter input of a first of the serially connected inverters 345 to an inverter output of a last of the serially connected inverters 347. Moreover, an inverter input of at least one the inverters, such as inverter 346, is also responsive to the clock signal CLK and the control inputs of at least one the inverters is responsive to the control signal VCTL. Finally, FIG. 3 also illustrates a clock signal inverter 341 that includes a clock signal inverter input and a clock signal inverter output, wherein the clock CLK is connected to the clock signal inverter 341 input, and wherein the clock signal inverter 341 output is connected to an input of one of the plurality of serially connected inverters, such as inverter 346.

Figure 4A:
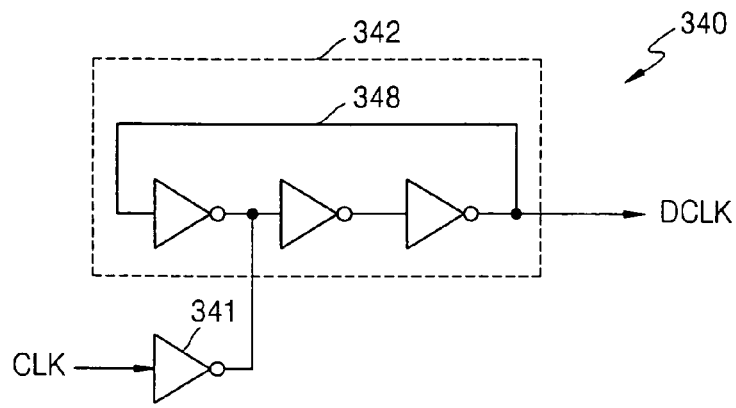
FIG. 4A illustrates a ring oscillator that can provide a delay circuit of FIG. 3 according to exemplary embodiments of the present invention.
Figure 4B:
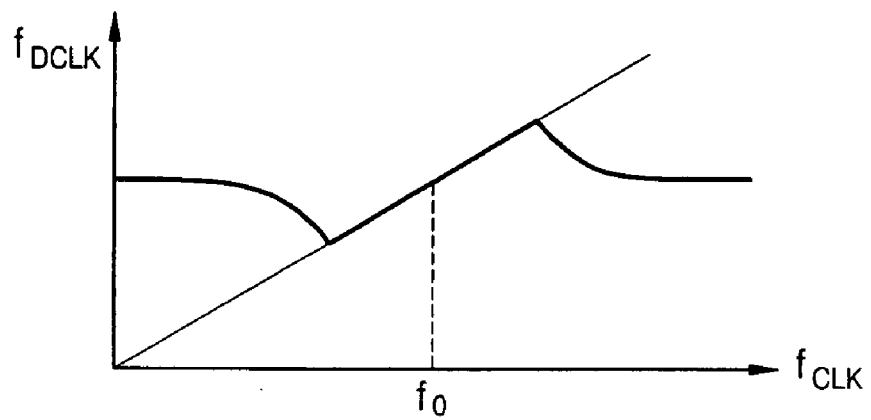
FIG. 4B is a graph illustrating a relationship in frequency between an input clock signal and an output clock signal in the ring oscillator of FIG. 4A according to exemplary embodiments of the present invention.

FIG. 4A illustrates an oscillator 342 consisting of four inverters, which can be a type of the delay circuit 340. FIG. 4B is a graph illustrating the relationship in frequency between an input clock signal CLK and an output clock signal DCLK in the oscillator 340' of FIG. 4A. Referring to FIG. 4B, in the ring oscillator 342, when the frequency $f_{CLK}$ of the input clock signal CLK is almost equal to the frequency $f_0$ of the ring oscillator 342, the frequency $f_{DCLK}$ of the output clock signal DCLK maintains the frequency $f_{CLK}$ of the input clock signal CLK. When the frequency $f_0$ of the ring oscillator 342 can be equalized with the frequency $f_{CLK}$ of the input clock signal CLK, the ring oscillator 342 of FIG. 4A may be used as the delay circuit 340. Accordingly, the output clock signal is of same frequency as the input clock signal, but is of different phase therefrom.

Figure 5A:
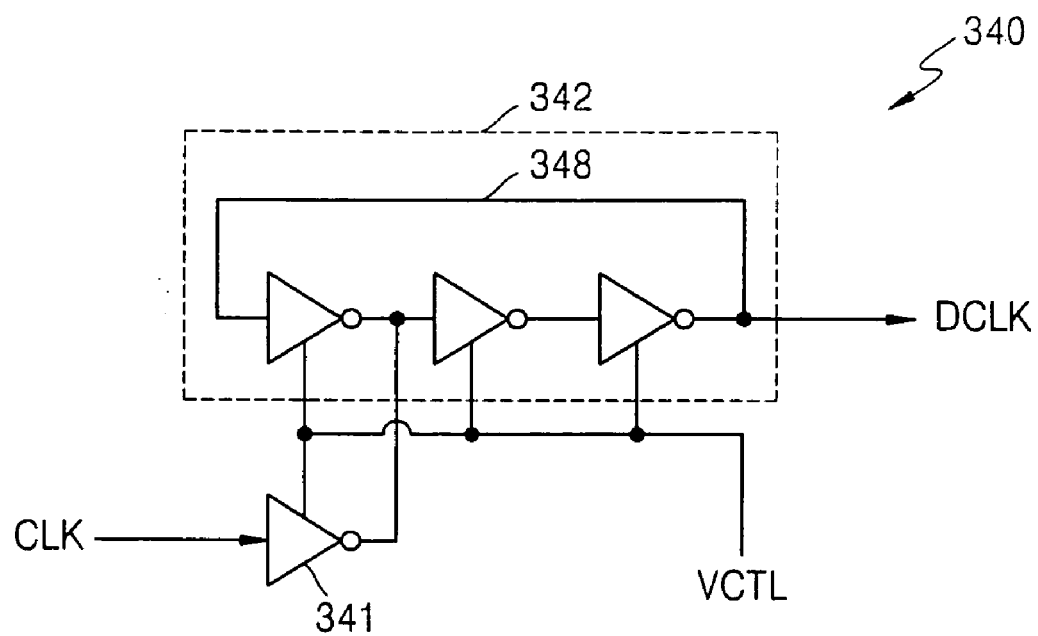
FIG. 5A is a circuit diagram of a ring oscillator of FIG. 4A according to exemplary embodiments of the present invention.
Figure 5B:
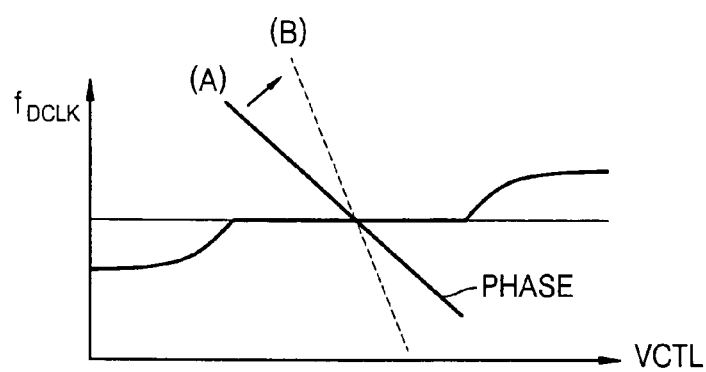
FIG. 5B is a graph illustrating a relationship among the voltage of a control signal and the frequency and phase of an output clock signal, shown in FIG. 5A according to exemplary embodiments of the present invention.

FIG. 5A illustrates controlling of the oscillator 342 of FIG. 4A using a control signal VCTL. FIG. 5B illustrates the relationship among the voltage of the control signal VCTL, and the frequency and phase of the output clock signal DCLK, shown in FIG. 5A. Referring to FIGS. 3 and 5A, in these embodiments, the control signal VCTL is provided to the power supply input of the inverters 341 and 345 through 347 of the delay circuit 340 of FIG. 3 and to all the inverters in the delay circuit 340 of FIG. 5A. A ground voltage also may be applied to the inverters. It is assumed that the frequency $f_{CLK}$ of the input clock signal CLK input to the delay circuit 340 falls within the range of the frequency $f_0$ of the ring oscillator 342, i.e., a frequency maintaining region is provided, and the voltage of the control signal VCTL changes. In this case, the frequency $f_{DCLK}$ of the output clock signal DCLK is equal to the frequency $f_{CLK}$ of the input clock signal CLK, but the phase of the output clock signal DCLK changes as shown in (A) of FIG. 5B. In other words, the degree of delay in the delay circuit 340 is determined by the voltage of the control signal VCTL generated by the loop filter 330 of FIG. 3. (B) of FIG. 5B illustrates that the phase of the output clock signal DCLK is increased, which will be described in more detail with reference to FIGS. 6 and 7.

Accordingly, an oscillator 342 having the characteristics described with reference to FIGS. 4B and 5B may be used as the delay circuit 340. That is, when the input clock signal CLK is input to the delay circuit 340, the delay circuit 340 generates the output clock signal DCLK whose frequency corresponds to the frequency of the input clock signal CLK. Since the output clock signal DCLK is obtained by delaying the input clock signal CLK for a predetermined time according to the voltage of the control signal VCTL, the output clock signal DCLK is out of phase with the input clock signal CLK. When the oscillator 342 of FIG. 4A is used as the delay circuit 340, the input clock signal CLK input to the oscillator 342 can reduce or prevent the ring oscillator 342 from being affected by the jitter generated in the ring oscillator 342. Also, external jitter contained in the input clock signal CLK is combined with a feedback signal generated by the ring oscillator 342, and can be reduced. Such characteristics of the frequency-obeying oscillator 342 used as the delay circuit 340 can allow the DLL 300 to stably generate the output clock signal DCLK with reduced sensitivity to internal and external jitter.

The phase detector 310 of FIG. 3 receives the output clock signal DCLK as a feedback signal. In some embodiments, the phase detector 310 is capable of receiving an output of a delay replica unit 350 of FIG. 3 as the feedback signal. That is, when embodiments of the present invention are used in an application, such as a semiconductor memory device, a video/audio processing system and/or a communications system, the output clock signal DCLK is buffered by an output buffer 360 of FIG. 3 and the buffered output clock signal DCLK is output, as a DQ signal DQS, outside the DLL 300. To generate the output clock signal DCLK in the DLL 300, the output clock signal DCLK may be delayed by the delay replica unit 350 for the amount of time that the output clock signal DCLK is delayed by the output buffer 360, and a signal output from the delay replica unit 350 may be input to the phase detector 310.

The phase detector 310 receives the output clock signal DCLK or the signal output from the delay replica unit 350, detects the phase difference between the feedback signal and the input clock signal CLK, and outputs the result of the detection to the charge pump 320. Then, the charge pump 320 generates a current corresponding to the result of detection. Next, the loop filter 330 generates the control signal VCTL as a voltage level that corresponds to the current generated by the charge pump 320. The circuit structures and operations of the phase detector 310, the charge pump 320, and the loop filter 330 are well known to those ordinarily skilled in the art, and a detailed description thereof need not be provided.

Figure 6:
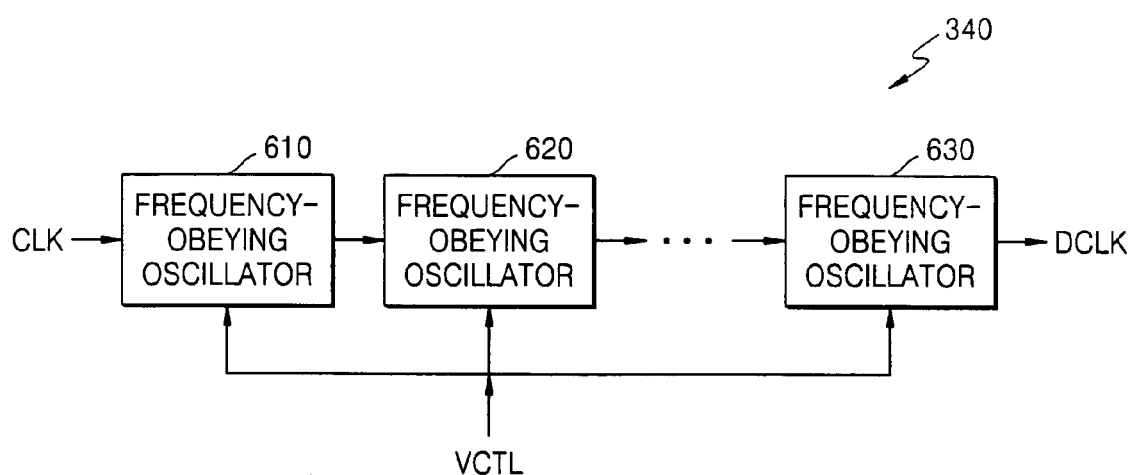
FIG. 6 is a block diagram of a delay circuit, such as shown in FIG. 3, according to other exemplary embodiments of the present invention.

FIG. 6 is a block diagram of a delay circuit 340 of FIG. 3 according to other exemplary embodiments of the present invention. Referring to FIG. 6, the delay circuit 340 includes a plurality of frequency maintaining oscillators, also referred to as frequency-obeying oscillators, 610 through 630, connected in series. The structure of the delay circuit 340 can increase the degree that an input clock signal CLK is delayed. That is, when a plurality of frequency-obeying oscillators such as that shown in FIG. 5A are connected in series, the phase of an output clock signal DCLK can change as shown in (B) of FIG. 5B.

Figure 7:
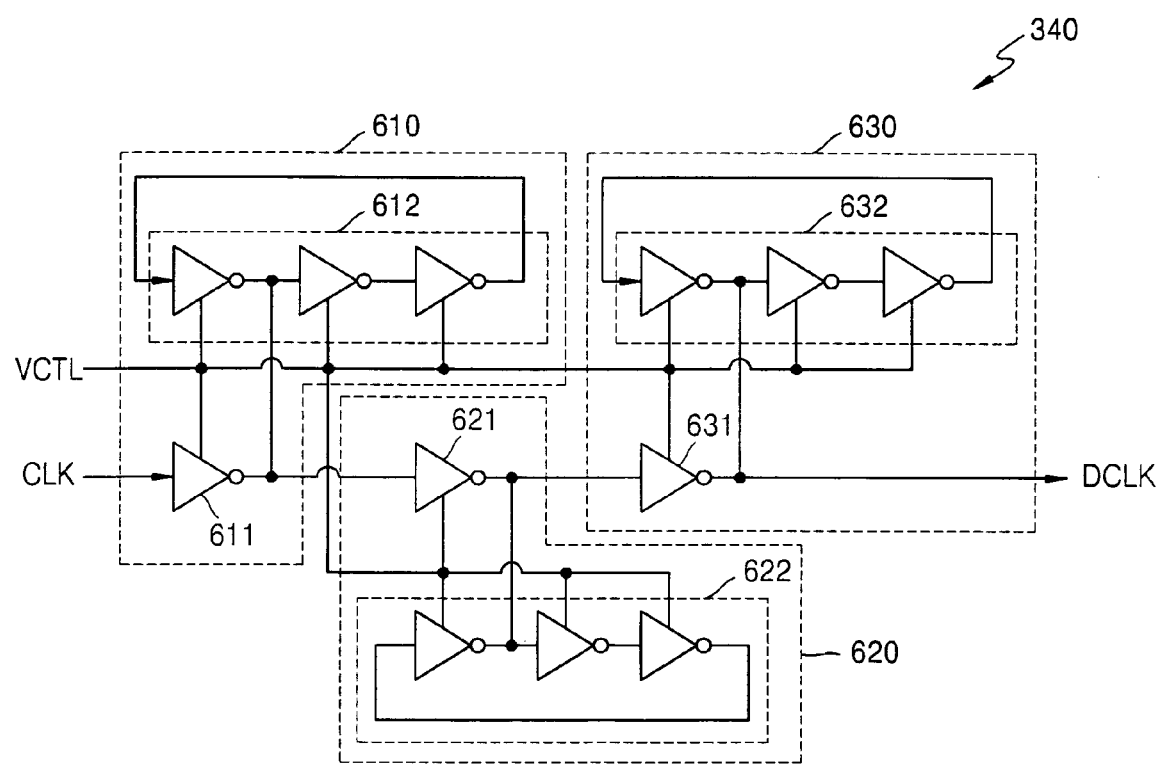
FIG. 7 is a circuit diagram illustrating connection of ring oscillators of FIG. 6 according to other exemplary embodiments of the present invention.

FIG. 7 is a circuit diagram illustrating a connection of the frequency-obeying oscillators 610 through 630 of FIG. 6, according to exemplary embodiments of the present invention. Referring to FIG. 7, the frequency-obeying oscillators 610 through 630 are connected in series, each of which uses four inverters such as those shown in FIG. 5A. The operation of each of the frequency-obeying oscillators 610 through 630 can correspond to that of the frequency-obeying oscillator 340 of FIG. 5A. More specifically, the first frequency-obeying oscillator 610 includes a first inverter 611 and a first ring oscillator 612. The first frequency-obeying oscillator 610 changes the phase of the input clock signal CLK in response to a control signal VCTL, and generates a first output signal whose frequency corresponds to the frequency of the input clock signal CLK. The second frequency-obeying oscillator 620 includes a second inverter 621 and a second ring oscillator 622. The second frequency-obeying oscillator 620 changes the phase of the first output signal in response to the control signal VCTL, and generates a second output signal whose frequency corresponds to the frequency of the first output signal. The third frequency-obeying oscillator 630, which is a final oscillator, includes a third inverter 631 and a third ring oscillator 632. The third frequency-obeying oscillator 630 changes the phase of the second output signal in response to the control signal VCTL, and generates the output clock signal DCLK whose frequency corresponds to the frequency of second output signal.

As described above, according to exemplary embodiments of the present invention, a ring oscillator changes the frequency of an output clock signal according to the frequency of an input clock signal, and changes the phase of the output clock signal in response to a control signal. A delay looped lock (DLL) according to exemplary embodiments of the present invention is capable of generating a stable output clock signal by reducing or minimizing influences caused by both internal jitter and external jitter.

Since a DLL according to exemplary embodiments of the present invention generates a clock signal that can be robust to both internal jitter and external jitter, it is possible to stably operate a system by applying the DLL to a semiconductor memory device, a video/audio processing system, a communications system and/or other applications.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A delay locked loop comprising:
a delay circuit that is configured to generate an output clock signal by delaying an input clock signal according to a voltage of a control signal, the delay circuit comprising an oscillating circuit to which the input clock signal is input;
a phase detector that is configured to receive the output clock signal as a feedback signal, to detect a phase difference between the input clock signal and the feedback signal, and to output a result of detection;
a charge pump that is configured to generate a current corresponding to the result of detection; and
a loop filter that is configured to output the control signal as a voltage that corresponds to the current;
wherein the oscillating circuit is configured to change a phase of the output clock signal in response to the control signal while maintaining the frequency of the output clock signal to correspond to the frequency of the input clock signal.

2. The delay locked loop of claim 1, further comprising:
an output buffer that is configured to buffer and output the output clock signal; and
a delay replica unit that is configured to delay the output clock signal for an amount of time that the output clock signal is delayed by the output buffer, and to output the result of delaying,
wherein the phase detector receives an output of the delay replica unit as the feedback signal.

3. A delay locked loop comprising:
a delay circuit that is configured to generate an output clock signal by delaying an input clock signal according to a voltage of a control signal, the delay circuit comprising an oscillating circuit to which the input clock signal is input;
a phase detector that is configured to receive the output clock signal as a feedback signal, to detect a phase difference between the input clock signal and the feedback signal, and to output a result of detection;
a charge pump that is configured to generate a current corresponding to the result of detection; and
a loop filter that is configured to output the control signal as a voltage that corresponds to the current;
wherein the delay circuit comprises:
an inverter that is configured to invert the input clock signal; and
an oscillator comprising a plurality of inverters, the plurality of inverters connected in series such that an output of a final inverter, which outputs the output clock signal, is fed back to a first inverter and a predetermined inverter of the plurality of inverters simultaneously receives both a signal output from a preceding inverter and the signal obtained by inverting the input clock signal.

4. The delay locked loop of claim 3, wherein an inverter receiving a signal output from the first inverter simultaneously receives both the signal obtained by inverting the input clock signal and the signal output from the first inverter.

5. A delay locked loop comprising:
a delay circuit that is configured to generate an output clock signal by delaying an input clock signal according to a voltage of a control signal, the delay circuit comprising an oscillating circuit to which the input clock signal is input;
a phase detector that is configured to receive the output clock signal as a feedback signal, to detect a phase difference between the input clock signal and the feedback signal, and to output a result of detection;
a charge pump that is configured to generate a current corresponding to the result of detection; and
a loop filter that is configured to output the control signal as a voltage that corresponds to the current;
wherein the delay circuit comprises a plurality of oscillators connected in series, such that a final oscillator outputs the output clock signal; and
wherein each of the plurality of oscillators is configured to change the phase of an input signal in response to the control signal and to output an output signal whose frequency corresponds to the frequency of the input signal.

6. A method of locking a clock signal, comprising:
generating an output clock signal by delaying an input clock signal according to a voltage of a control signal, using an oscillating circuit to which the input clock signal is input;
detecting a phase difference between the input clock signal and the output clock signal, and outputting a result of detection;
generating a current corresponding to the result of detection; and
outputting the control signal as a voltage which corresponds to the generated current;
wherein the oscillating circuit changes the phase of the output clock signal in response to the control signal, and maintains the frequency of the output clock signal to correspond to the frequency of the input clock signal.

7. The method of claim 6, further comprising:
buffering and outputting the output clock signal; and
delaying the output clock signal for an amount of time that the output clock signal is delayed during the buffering of the output clock signal, and outputting a result of the delaying,
wherein a signal obtained by delaying the output clock signal is used as the output clock signal during the detecting the phase difference.

8. A method of locking a clock signal, comprising:
generating an output clock signal by delaying an input clock signal according to a voltage of a control signal, using an oscillating circuit to which the input clock signal is input;
detecting a phase difference between the input clock signal and the output clock signal, and outputting a result of detection;
generating a current corresponding to the result of detection; and
outputting the control signal as a voltage which corresponds to the generated current;
wherein the delaying of the input clock signal comprises:
inverting the input clock signal;

oscillating the oscillating circuit using a plurality of inverters connected in series such that an output of a final inverter, which outputs the output clock signal, is fed back to a first inverter; and allowing a predetermined inverter of the plurality of inverters to simultaneously receive both a signal output from a preceding inverter and the signal obtained by inverting the input clock signal.

9. The method of claim 8, wherein an inverter receiving the signal output from the first inverter simultaneously receives both the signal output from the first inverter and the signal obtained by inverting the input clock signal.

10. A delay locked loop comprising:

a ring oscillator including a plurality of serially connected inverters and a feedback path around the plurality of serially connected inverters, the ring oscillator being configured to generate an output clock signal that is a delayed version of an input clock signal, in response to the input clock signal and to a control signal that is applied to the ring oscillator; and a phase-responsive circuit that is configured to generate the control signal in response to a phase difference between the input clock signal and the output clock signal;

wherein the output clock signal is of same frequency as the input clock signal but is of different phase therefrom.

11. A delay locked loop of claim 10 wherein a respective inverter includes an inverter input, an inverter output and a control input, wherein the plurality of inverters are serially connected by connecting an inverter output of an immediately preceding inverter to an inverter input of an immediately succeeding inverter, and wherein the feedback path is provided by connecting an inverter input of a first of the serially connected inverters to an inverter output of a last of the serially connected inverters, wherein an inverter input of at least one of the inverters is also responsive to the clock signal and wherein the control inputs of at least one of the inverters is responsive to the control signal.

12. A delay locked loop of claim 11 further comprising a clock signal inverter that includes a clock signal inverter input and a clock signal inverter output, wherein the clock signal is connected to the clock signal inverter input and wherein the clock signal inverter output is connected to an input of one of the plurality of serially connected inverters.

13. A delay locked loop of claim 10 further comprising:

an output buffer that is configured to buffer the output clock signal; and a delay replica unit that is configured to delay the output clock signal by an amount of time that the output clock signal is delayed by the output buffer;

wherein the phase responsive circuit is responsive to a phase difference between the input clock signal and the delayed output clock signal that is delayed by the delay replica unit.

* * * * *